US012581608B2

(12) United States Patent
Maguire et al.

(10) Patent No.: US 12,581,608 B2
(45) Date of Patent: Mar. 17, 2026

(54) PIVOT LATCH HARDWARE FOR A NODE OF AN INFORMATION HANDLING SYSTEM

(71) Applicant: DELL PRODUCTS L.P., Round Rock, TX (US)

(72) Inventors: Amrita Sidhu Maguire, Cedar Park, TX (US); Chen Zhao, Shanghai (CN); John Donachy, Austin, TX (US); James Guyer, Northboro, MA (US); Yuxin Chen, Hangtou Pudong (CN); Harris Di Dihuweii, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 98 days.

(21) Appl. No.: 18/660,688

(22) Filed: May 10, 2024

(65) Prior Publication Data

US 2025/0351285 A1 Nov. 13, 2025

(51) Int. Cl.
*H05K 7/14* (2006.01)
*G06F 1/16* (2006.01)

(52) U.S. Cl.
CPC .......... *H05K 7/1411* (2013.01); *G06F 1/1679* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 6,579,029 B1 * | 6/2003 | Sevde | .................. | H05K 7/1414 |
| | | | | 403/321 |
| 6,683,785 B1 * | 1/2004 | Chen | .................... | G11B 33/124 |
| | | | | 360/137 |
| 8,498,104 B2 * | 7/2013 | Lin | ......................... | G06F 1/187 |
| | | | | 361/679.31 |
| 10,517,183 B1 * | 12/2019 | Huang | ................. | H05K 7/1487 |
| 11,330,728 B2 * | 5/2022 | Ye | ........................... | H05K 5/023 |
| 11,412,634 B2 * | 8/2022 | Xiaogang | ............. | E05B 13/005 |
| 2017/0071071 A1 | 3/2017 | Tseng et al. | | |
| 2017/0150634 A1 * | 5/2017 | Huang | ................. | H05K 7/1489 |
| 2020/0170136 A1 * | 5/2020 | Huang | ................... | B25B 27/14 |
| 2020/0267869 A1 | 8/2020 | Hung et al. | | |
| 2021/0270056 A1 * | 9/2021 | Tower | ....................... | E05B 9/02 |
| 2023/0085694 A1 * | 3/2023 | Chen | ......................... | E05C 3/10 |
| | | | | 211/79 |
| 2023/0133031 A1 * | 5/2023 | Wingfield | ............ | H05K 7/1489 |
| | | | | 361/679.01 |

* cited by examiner

*Primary Examiner* — James Wu
*Assistant Examiner* — Christopher L Augustin
(74) *Attorney, Agent, or Firm* — Larson Newman, LLP

(57) ABSTRACT

A pivot latch for a node of an information handling system including a main support, a hinge, a latch handle, and a button. The main support attaches to the node. The hinge is located at the end of the main support. The latch handle extends downward from the hinge. The latch handle transitions between a default position and a perpendicular position. A force is exerted against the latch handle when the latch handle is in the perpendicular position. The button is in physical communication with the main support and with the latch handle. When the button is moved to an unlock position, the latch handle automatically rotates a partial distance between the default position and the perpendicular position.

18 Claims, 9 Drawing Sheets

PIVOT LATCH HARDWARE FOR A NODE OF AN INFORMATION HANDLING SYSTEM

FIELD OF THE DISCLOSURE

The present disclosure generally relates to information handling systems, and more particularly relates to pivot latch hardware for a node of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A pivot latch for a node of an information handling system includes a main support, a hinge, a latch handle, and a button. The main support attach to the node. The hinge may be located at an end of the main support. The latch handle may extend downward from the hinge. The latch handle may transition between a default position and a perpendicular position. A force may be exerted against the latch handle when the latch handle is in the perpendicular position. The button is in physical communication with the main support and with the latch handle. When the button is moved to an unlock position, the latch handle may automatically rotate a partial distance between the default position and the perpendicular position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
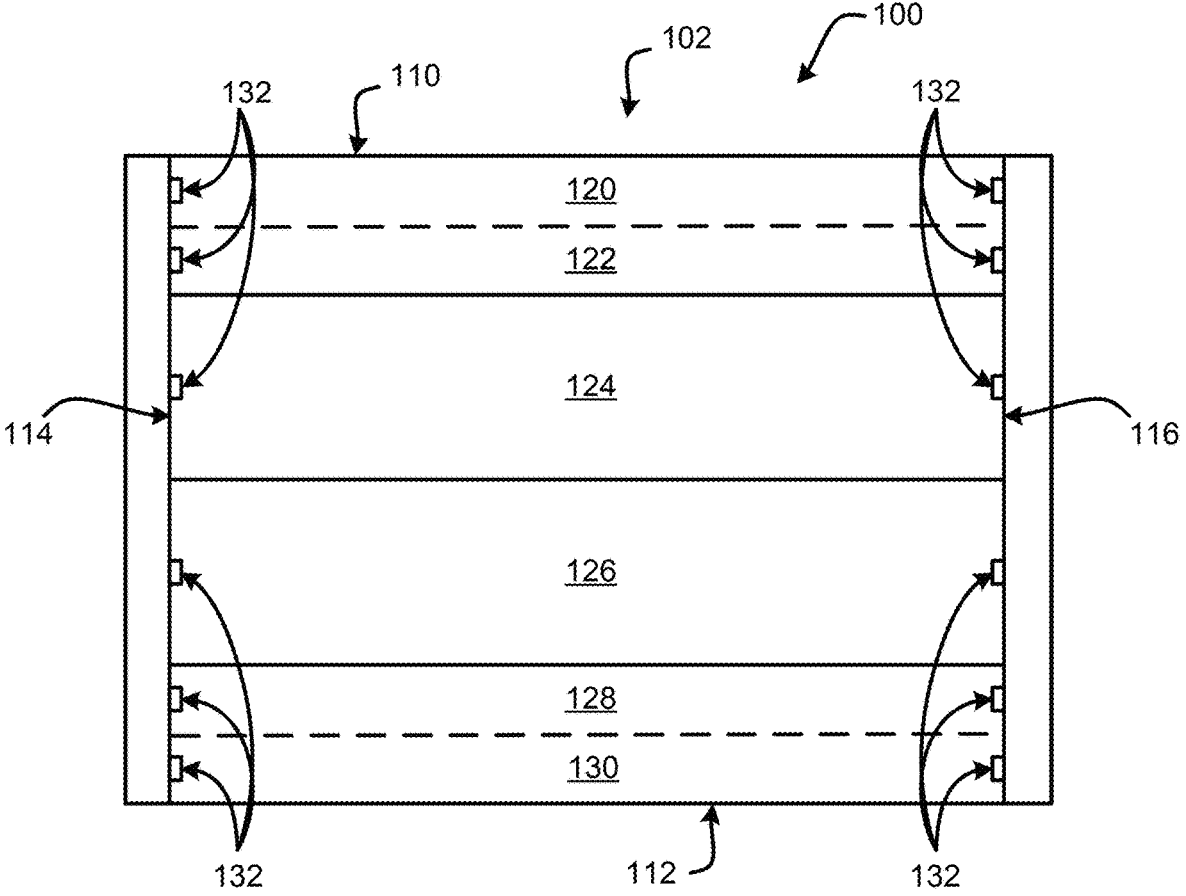
FIG. 1 is a block diagram of an information handling system according to at least one embodiment of the present disclosure.

FIG. 1 illustrates an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a chassis 102, which in turn includes a top panel 110, a bottom panel 112, and side panels 114 and 116. Chassis 102 may further include multiple slots 120, 122, 124, 126, 128, and 130, and each of the slots includes a pair of sled/node mounting rails 132. In an example, the mounting rails 132 may be connected to side panels 114 and 116. While slots 120, 122, 124, 126, 128, and 130 are illustrated as filling the entire height of chassis 102, such as from bottom panel 112 to top panel 110, other components may be located with the chassis. Information handling system 100 may include additional components without varying from the scope of this disclosure.

In certain examples, slots 120, 122, 124, 126, 128, and 130 may have different heights, such as a U height. For example, slots 120, 122, 128, and 130 may be 1U slots, and slots 124 and 126 may be 2U slots. In an example, when a sled, such as sled 200 in FIG. 2, slides into or out of a particular slot, the sled may slide along a pair of mounting rails 132. In certain examples, handles for a sled may be located near the edges of the sled so that fans and other components may occupy the other areas of a back panel of the sled. In these examples, the handles may be too close to side panels 114 and 116 such that an individual may not be able to properly grip the handles without hitting the side panels. Additionally, the nodes may weigh above forty pounds and may be long in length. In this situation, the individual may need to use a large extraction force to remove the sled. Information handling system 100 may be improved by a pivoting latch hardware being utilized during the removal and insertion of the sled as will be described herein.

Figure 2:
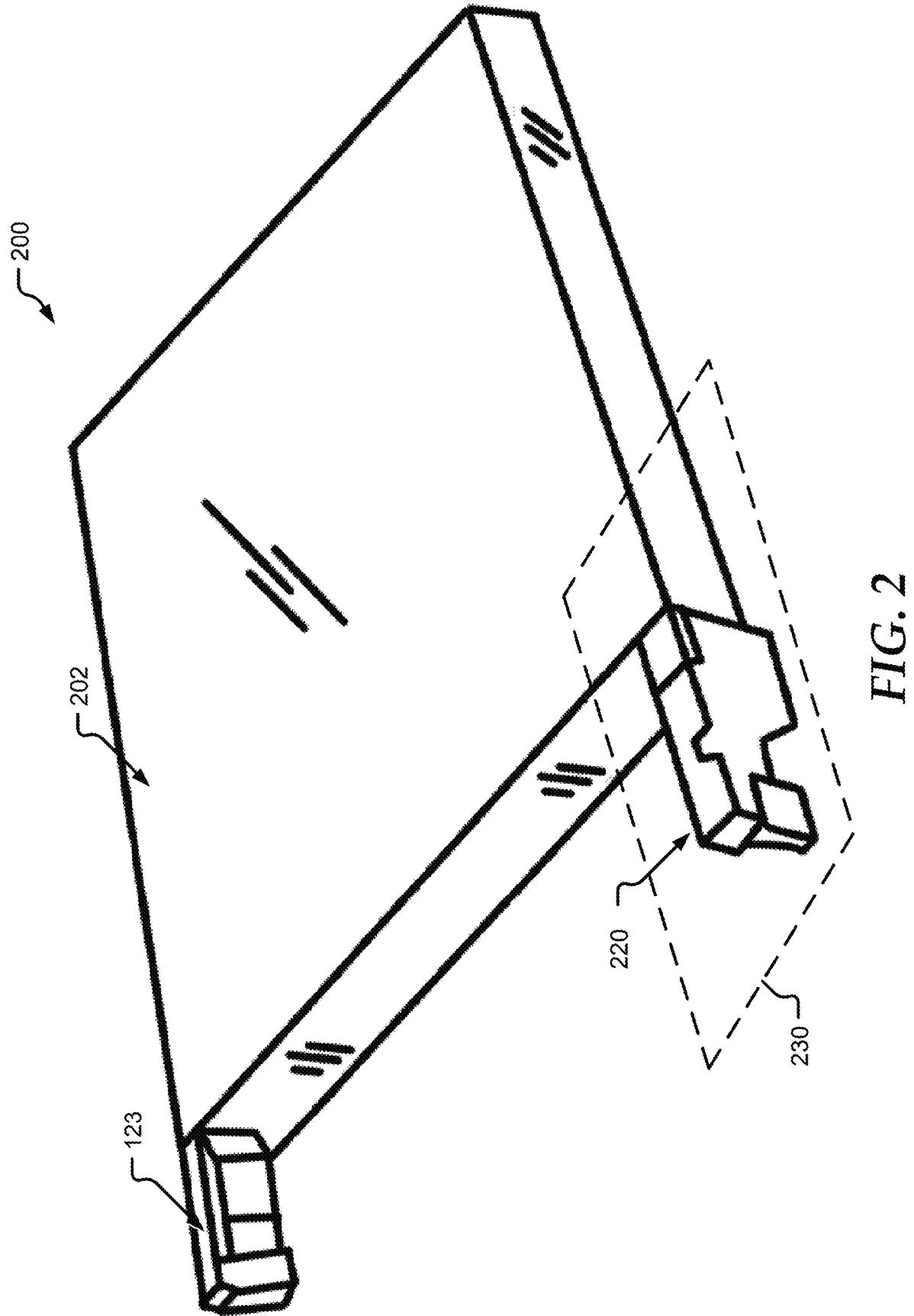
FIG. 2 is a perspective view of a node for a server rack according to at least one embodiment of the present disclosure.

FIG. 2 illustrates a node 200 for an information handling system/server rack, such as information handling system 100 of FIG. 1, according to at least one embodiment of the present disclosure. Node 200 includes a chassis 202 and pivot latches 210 and 220. Node 200 may include additional components without varying from the scope of this disclosure.

In an example, pivot latch 210 may extend from one corner of chassis 202 and pivot latch 220 may extend from the other corner of the chassis. In certain examples, pivot latches 210 and 220 may extend from either front corners or rear corners of chassis 202. For example, if node 200 is inserted into and removed from a front edge of chassis 102 in FIG. 1, pivot latches 210 and 220 may extend from respective front corners of chassis 202. Alternatively, if node 200 is inserted into and removed from a rear edge of chassis 102 in FIG. 1, pivot latches 210 and 220 may extend from respective rear corners of chassis 202. In an example, if node 200 includes a reverse air flow platform where the input/output (I/O) is facing the cold aisle, such as the front of chassis 102 of FIG. 1, pivot latches 210 and 220 may extend from respective front corners of chassis 202. Alternatively, if node 200 includes an air flow platform where the I/O is facing the exhaust/hot aisle, such as the rear of chassis 102 of FIG. 1, pivot latches 210 and 220 may extend from respective rear corners of chassis 202. Pivot latches 210 and 220 may be utilized to remove sled 200 from within a chassis of an information handling system/server rack, such as chassis 102 of information handling system 100 of FIG. 1. As will be described herein, different components of pivot latch 210 may pivot/rotate, extend, unlock, snap into a particular position, or the like to enable an individual to better access to the pivot latch while removing sled 200 from within a chassis of an information handling system/server rack, such as chassis 102 of information handling system 100 of FIG. 1. Similarly, different components of pivot latch 220 may pivot/rotate, extend, unlock, snap into a particular position, or the like to enable an individual to better access to the pivot latch while removing sled 200 from within a chassis of an information handling system/server rack, such as chassis 102 of information handling system 100 of FIG. 1. In certain examples, the movements of the components of pivot latches 210 and 220 may be substantially similar. However, for clarity and brevity, the movements of only the components in pivot latch 220 will be described herein and these movements may be substantially similar for pivot latch 210. In an example, a portion 230 of node 200 will be illustrated and described in greater detail with respect to FIGS. 3-8.

FIGS. 3-8 illustrate portion 230 of node 200 including a portion of chassis 202 and pivot latch 220 in different positions according to at least one embodiment of the present disclosure. Pivot latch 220 includes main support 302, a latch handle 304, a release button 306, a button 308, and a hinge 310. Pivot latch 220 may include additional components without varying from the scope of this disclosure.

Figure 3:
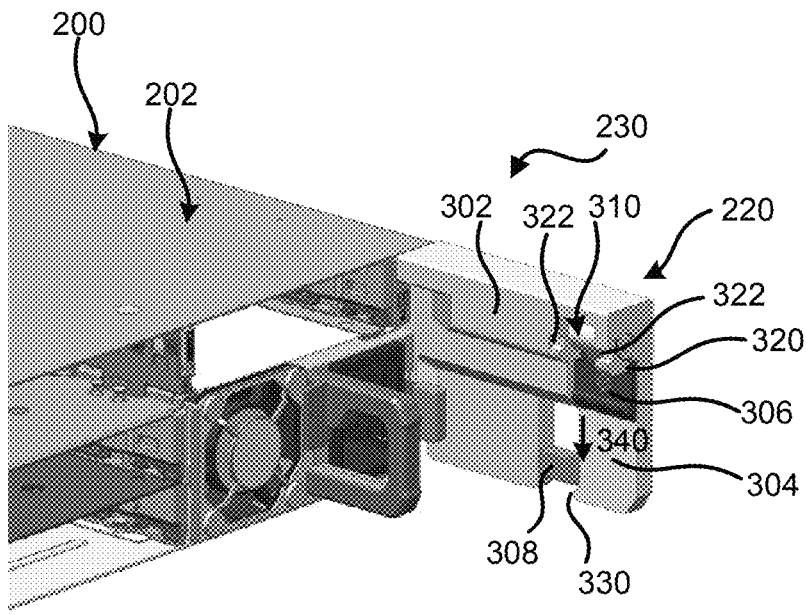
FIGS. 3-8 are perspective views of a portion of a node with a pivot latch in different positions according to at least one embodiment of the present disclosure.

Referring to FIG. 3, pivot latch 220 also includes lock notches 320 and 322. Latch handle 304 includes a catch portion 330. In an example, while pivot latch 220 is in the default position, one end of release button 306 may be located within lock notches 320. In this situation, latch handle 304 may be securely held in a downward position, such that an individual may not be able to grab hold of the latch handle. Additionally, when latch handle 304 is in the default position, one end of release button 308 may be located above catch portion 330 of the latch handle. In this situation, catch portion 330 may prevent release button from being pressed or pushed downward. In an example, a force may be exerted on button 306 in the direction of arrow 340. In response to this force, button 306 may slide along latch handle 304 in the direction of arrow 340. In certain examples, the movement of button 306 may cause an end of the button, such as catches 402 in FIG. 4, to be pulled out of lock notches 320.

Figure 4:
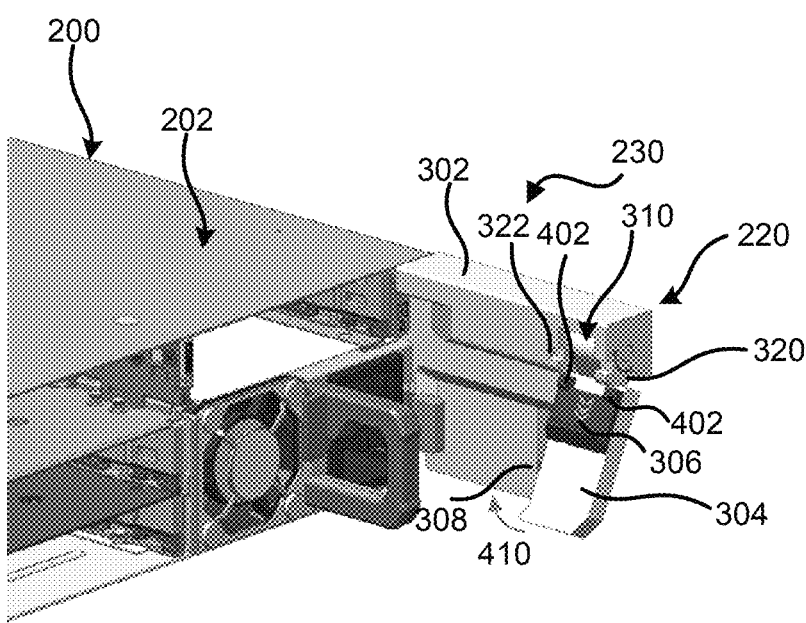
Figure 5:
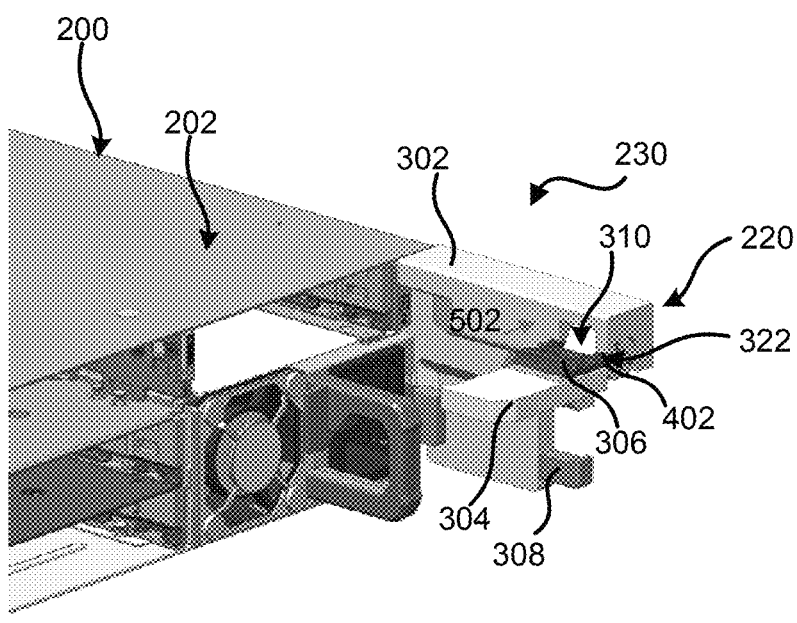
Figure 9:
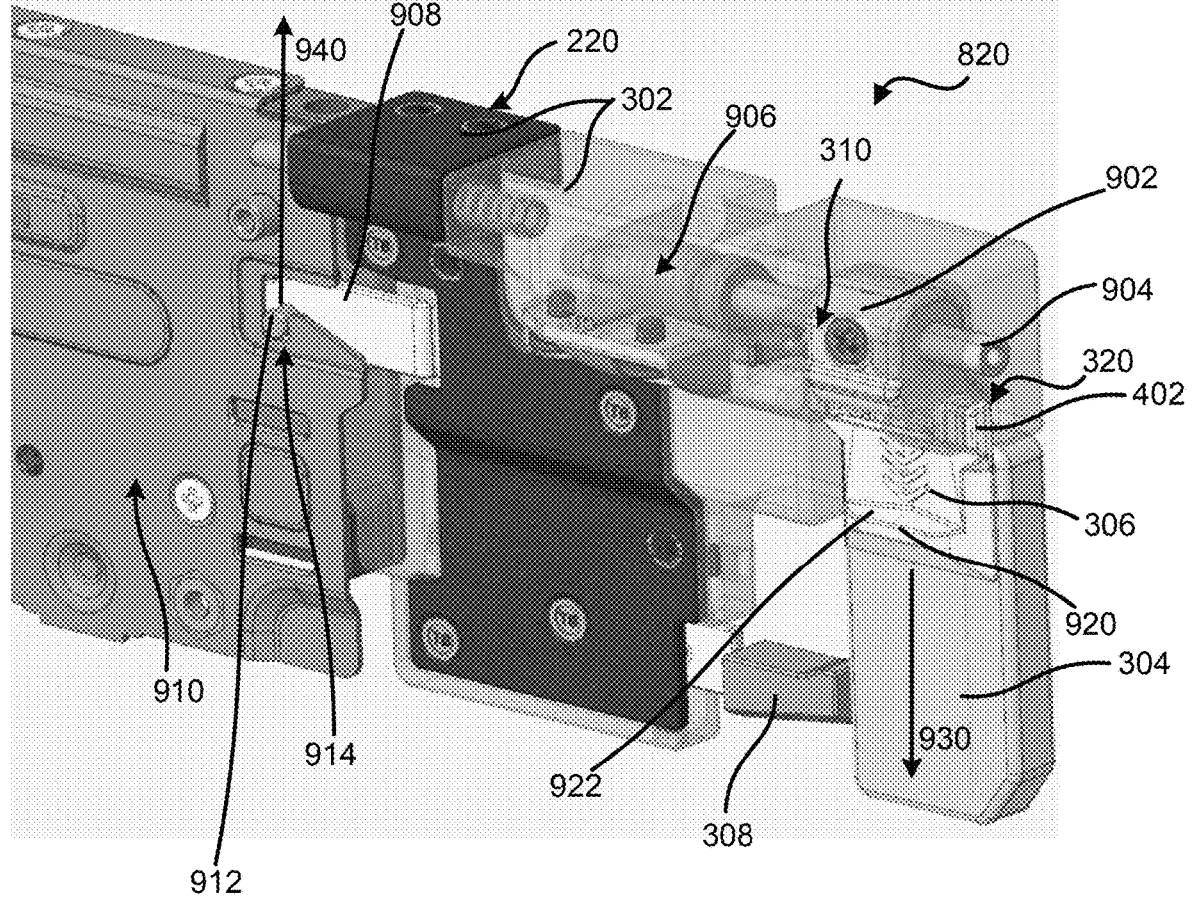
FIGS. 9 and 10 are perspective views of internal components of a pivot latch according to at least one embodiment of the present disclosure.

Referring to FIG. 4, when catches 402 are no longer within lock notches 320, a tension spring, such as tension spring 906 in FIG. 9, within main portion 302 and attached to hinge 310 may cause latch handle 304 to automatically rotate in the direction of arrow 410. In an example, the movement of latch handle 304 in the direction of arrow 410 may be any suitable amount. For example, latch handle 304 may merely 'pop-up', may fully rotate to a perpendicular position, or the like. In an example, as used herein 'pop-up' is a small distance that hinge 310 and the tension spring may cause latch handle 304 to rotate from the default position to the perpendicular position in the direction of arrow 410. In this example, an individual may exert as force on latch handle 304 to continue the rotation of the latch handle in the direction of arrow 410 until catches 402 are aligned with lock notches 322 as illustrated in FIG. 5. In certain examples, the tension spring and hinge 306 may cause latch handle 304 to continue to rotate until catches 402 are aligned with lock notches 322 without any additional force being added to the latch handle.

Referring to FIG. 5, when catches 402 of button 306 are aligned with lock notches 322, the button may automatically snap fit within the lock notches. In an example, a spring may be located within latch handle 304 and this spring may bias catches 402 of button 306 toward lock notches 320 and 322. In certain examples, button 306 may move in the direction of arrow 502 to enable/cause catches 402 to snap fit within lock notches 322. In an example, when catches 402 are within lock notches 322, latch handle 304 may be securely held in the perpendicular position. As used herein, the perpendicular position refers to latch handle 304 being in a position that is perpendicular to main support 302 as illustrated in FIG. 5. While latch handle 304 is in the perpendicular position, pivot latch 220 may be positioned to enable an individual to pull on the latch handle, which in turn may exert a force on chassis 202 as will be described herein.

Figure 6:
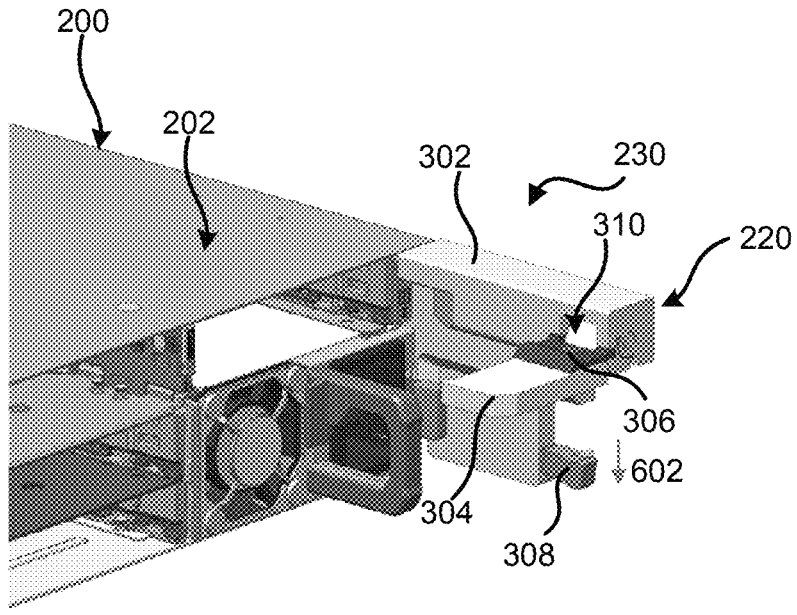

Referring to FIG. 6, a force may be exerted on release button 308 in the direction of arrow 602. Based on this force, release button 308 may enable pivot latch 220 to further extend from within chassis 202. In an example, release button 308 may move in the direction of 602, which in turn may release a catch located within main portion 302 as will be described with respect to FIGS. 9 and 10 below.

Figure 7:
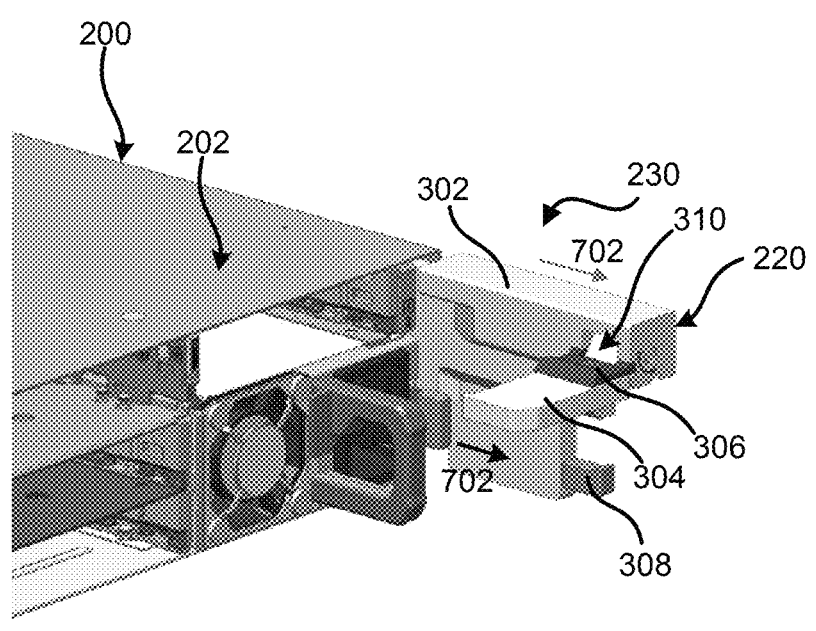

Referring to FIG. 7, after release button 308 has been moved in the direction of arrow 602 illustrated in FIG. 6, a force may be exerted on latch handle 304 in the direction of arrow 702. In an example, this force may be transferred to main support 302 through hinge 310. In response to the force, pivot latch 220 may slide in the direction of arrow 702. This movement of pivot latch 220 may cause pivot latch to extend further from chassis 202 as illustrated in FIG. 8.

Figure 8:
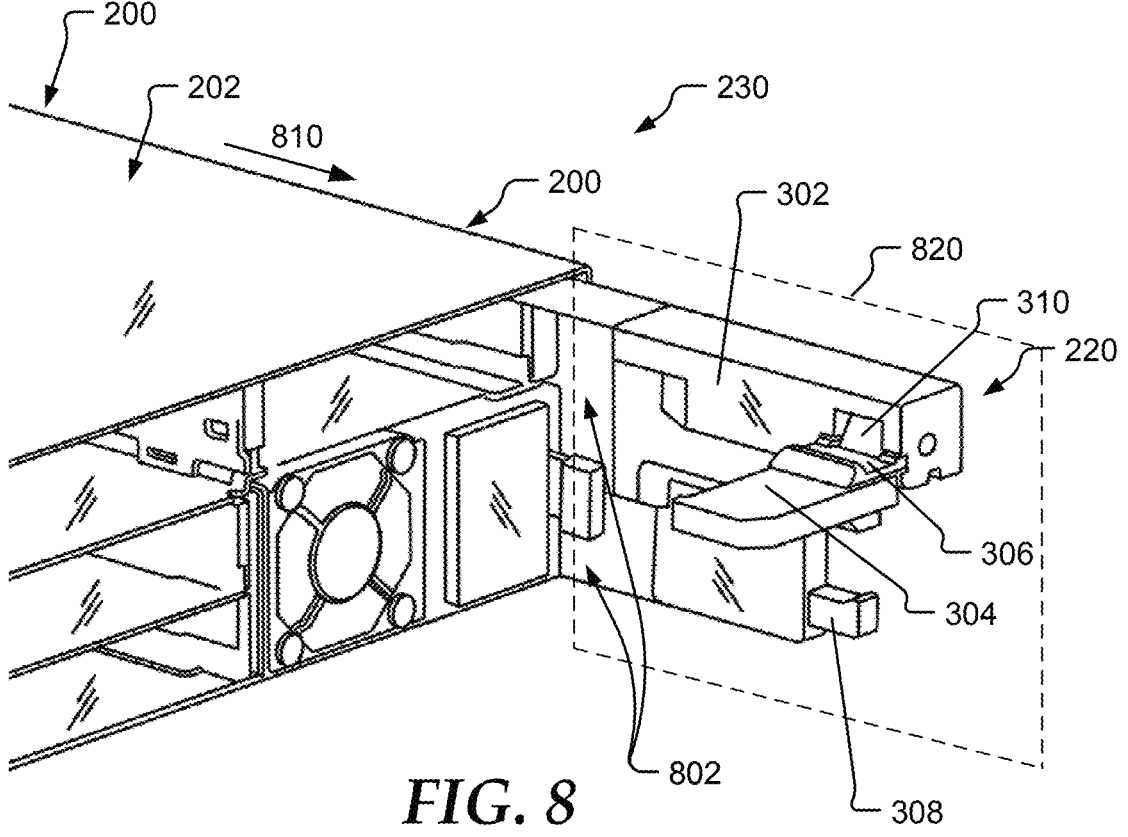

Referring to FIG. 8, additional support 802 may extend from within chassis 202. When additional support 802 extends from within chassis 202, there may be sufficient space between latch handle 304 and the back of the chassis for an individual to grab hold of the latch handle. After the individual has grabbed hold of latch handle 304, the individual may exert a force on pivot latch 220 that may be transferred to chassis 202 of node 200. In an example, the force applied to chassis 202 of node 200 may cause the node to be pulled in the direction of 810. As node 200 moves in the direction of arrow 810, the node may be pulled from within a chassis of an information handling system/server rack, such as chassis 102 of information handling system 100 of FIG. 1. Different components of pivot latch 220 within portion 820 will be described with respect to FIGS. 9 and 10.

Figure 10:
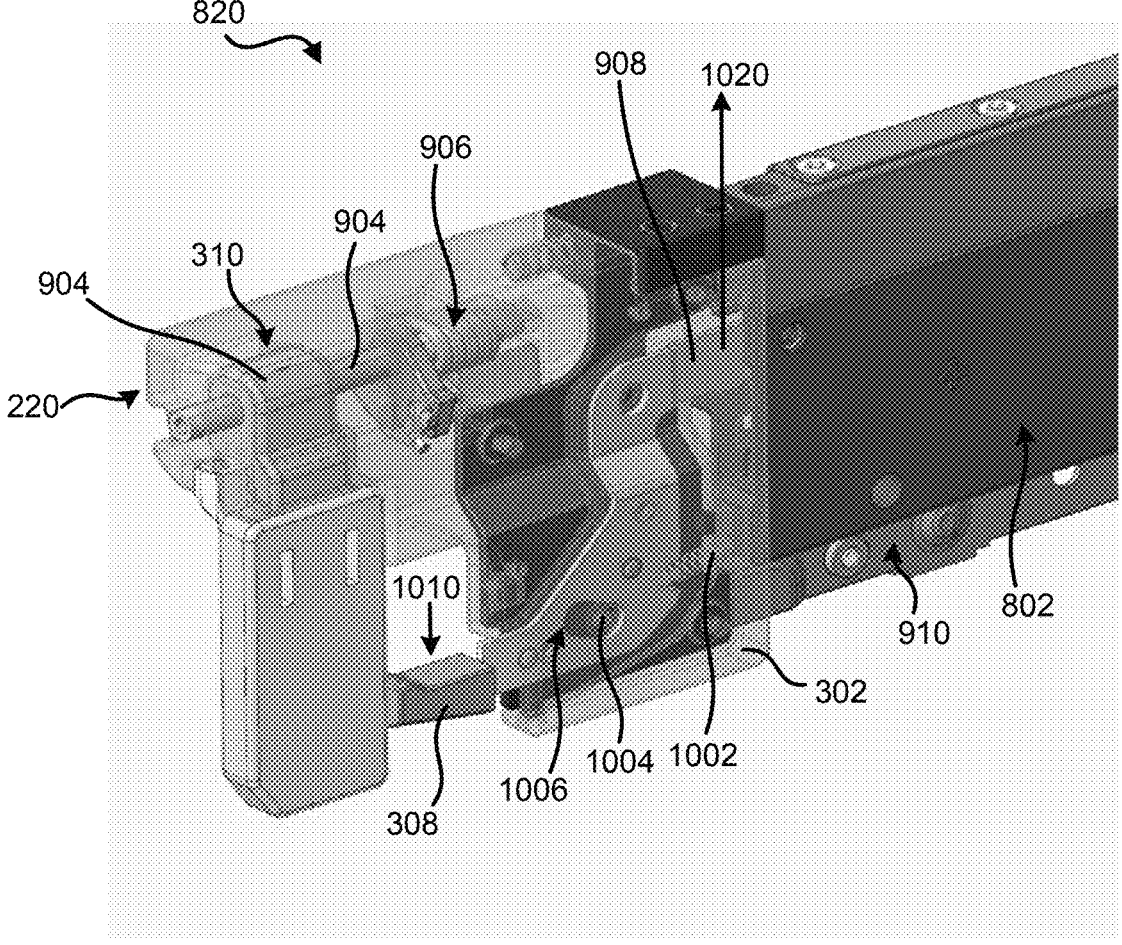

FIGS. 9 and 10 illustrate internal components of within portion 820 of pivot latch 220 according to at least one embodiment of the present disclosure. Hinge 310 includes a support component 902, a rotational bar 904, and a tension spring 906. In an example, support component 902 may be the top portion of latch handle 304. Pivot latch 220 further includes a release component 908 and a mounting frame 910. Pivot latch 220 may include additional components without varying from the scope of this disclosure.

Referring to FIG. 9, release component 908 includes a pin 912, and mounting frame 910 includes a recess portion 914. Button 306 includes a tab 920, which in turn includes a surface 922. In an example, a force may be exerted on surface 922 of tab 920 to move button 306 as described above with respect to FIG. 3. Based on the force being exerted on surface 922 of tab 920, button 306 may move in the direction of arrow 930. In an example, when button 306 moves in the direction of arrow 930 and catches 402 of the button are pulled from lock notches 320, tension spring 906 may exert a rotational force on rotational bar 904. This rotational force on rotational bar 904 may be transferred to support component 902 of hinge 310, which may cause latch handle 304 to automatically 'pop-up' as described above with respect to FIG. 4.

In an example, when pivot latch 220 is in the default position, pin 912 may be located within recess portion 914 of mounting frame 910. While pin 912 is located within recess portion 914, release component 908 is in a locked position to securely hold pivot latch 220 within the default position. While in release component 908 is in the locked position, main support 302 and additional support 802 may not be pulled out of mounting frame 910.

Referring to FIG. 10, pivot latch 220 includes a spring 1002, a pin 1004, and a guide channel 1006. In certain examples, spring 1002 may be a compression spring, such that the spring exerts a force on release component 908 to bias the release component toward the locked position. When release component 908 is in the locked position, pin 1004 may be in physical communication with one end of guide channel 1006 as illustrated in FIG. 10. In an example, when release button 308 is pressed in the direction of arrow 1010, the force on the release button may cause release component 908 to hinge. For example, the force in the direction of arrow 1010 may be greater than the force of spring 1002, such that as release component 908 moves the pin may be placed in physical communication with the other side of guide channel 1006.

Referring back to FIG. 9, the movement of release component 908 may cause pin 912 to move in the direction of arrow 940. Based on the movement of pin 912 in the direction of arrow 940, the pin may be raised above recess portion 914 such that the pin may be pull from within mounting frame 910. While a force is exerted on latch handle 304 and pin 912 is above recess portion 914, main support 302 and additional support 802 may be pull a particular distance out of mounting frame 910 as illustrated in FIG. 10.

Figure 11:
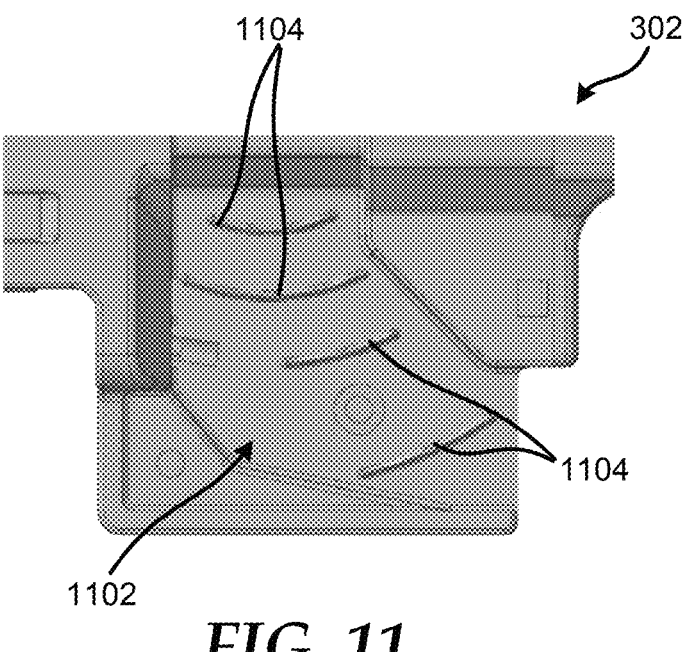
FIG. 11 is a side view of a portion of a lock channel according to at least one embodiment of the present disclosure.

FIG. 11 illustrates a portion of main support 302 including a lock channel 1102 according to at least one embodiment of the present disclosure. In an example, lock channel 1102 may include multiple glide ribs 1104. In certain examples, glide ribs 1104 may minimize any gaps between lock channel 1102 and release component 908 of FIG. 10. For example, glide ribs 1104 may reduce an case at which release component 908 of FIG. 10 moves within lock channel 1102.

Figure 12:
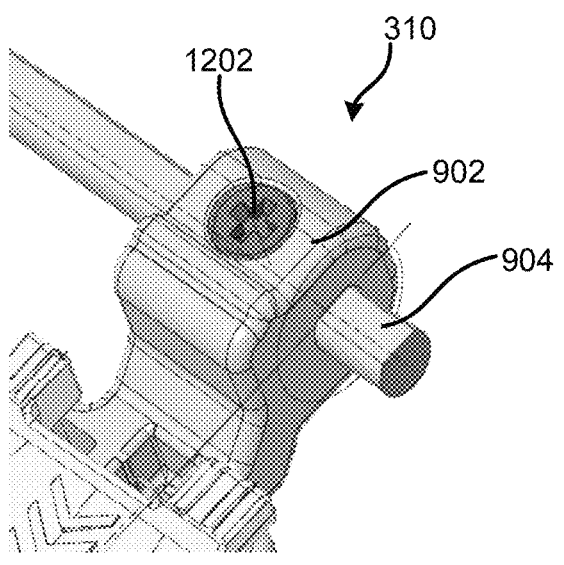
FIG. 12 is a perspective view of a rotational bar in a pivot latch according to at least one embodiment of the present disclosure.

FIG. 12 illustrates hinge 310 including a lock screw 1202, support component 902, and rotational bar 904 according to at least one embodiment of the present disclosure. In an example, lock screw 1202 may exert a force on both support component 902 and rotational bar 904 such that support component 902 may not slide with respect to rotational bar 904. In this example, as tension spring 906 of FIG. 9 causes rotational bar 904 to rotate, the physical interface of lock screw 1202 with the rotational bar and support component 902 may also cause latch handle 304 of FIG. 3 to rotate and 'pop-up' as described above with respect to FIG. 4.

Figure 13:
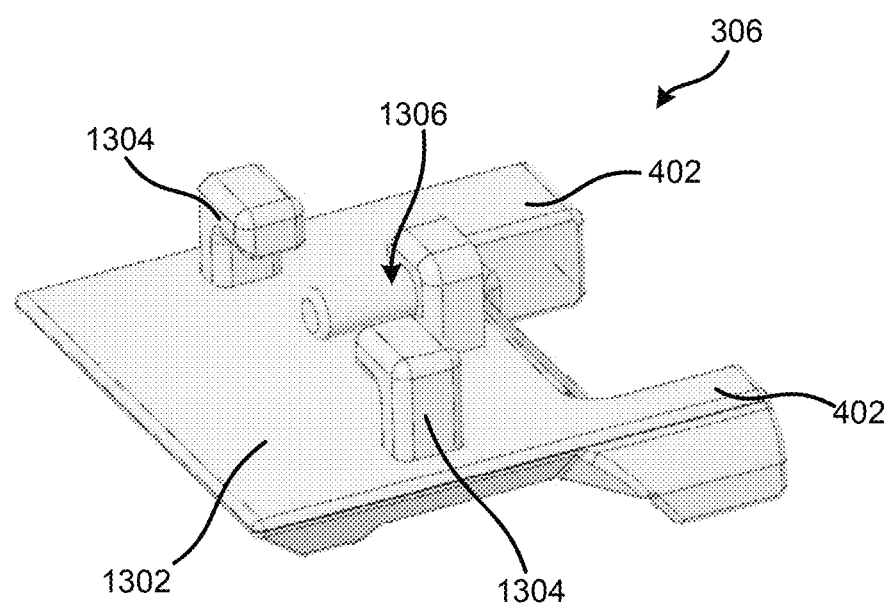
FIG. 13 is a perspective view of a button of a pivot latch according to at least one embodiment of the present disclosure.

FIG. 13 illustrates button 306 according to at least one embodiment of the present disclosure. Button 306 includes a back surface 1302, hook portions 1304, support rod 1306, and catches 402. Button 306 may include additional pieces without varying from the scope of this disclosure. In an example, hook portions 1304 may extend away from back surface 1302 for a particular distance and then extend toward the middle of button 306. In certain examples, hook portions 1304 may be located along opposite sides of back surface 1302 as illustrated in FIG. 13. Hook portions 1304 may engage with latch handle 304 in FIG. 14 below and secure button 306 on the latch handle. In an example, support rod 1306 may be utilized to bias button 306 in a locked position as will be described with respect to FIG. 14.

Figure 14:
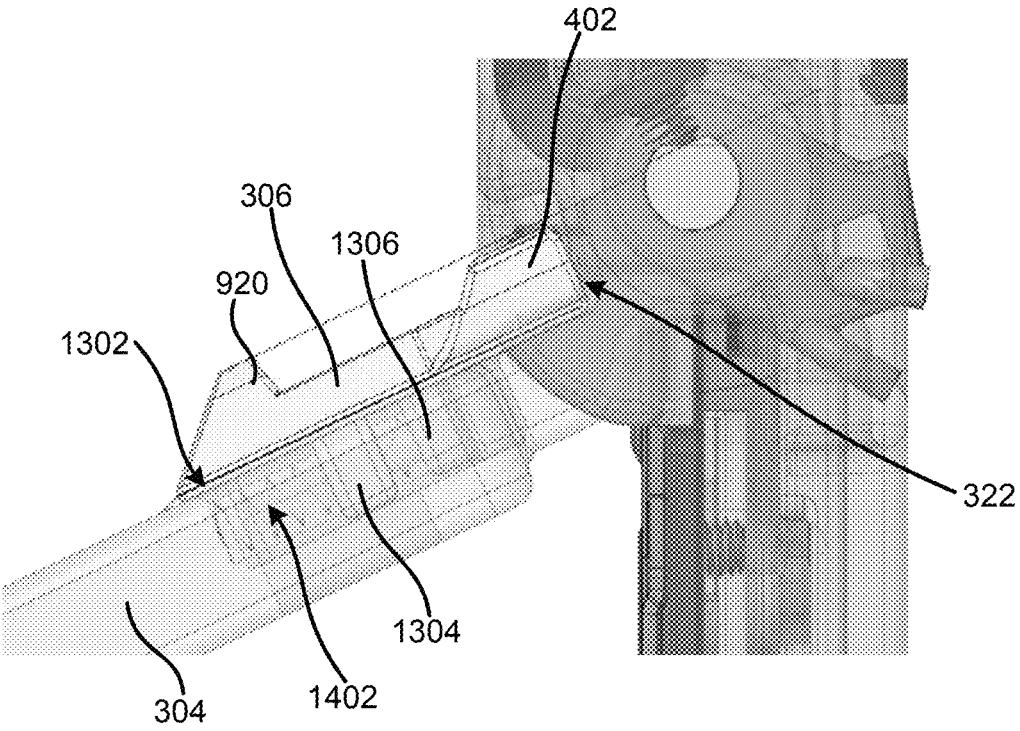
FIG. 14 is a side view of a portion of a pivot latch according to at least one embodiment of the present disclosure.

FIG. 14 illustrates a portion of pivot latch 220 according to at least one embodiment of the present disclosure. Pivot latch 220 includes a spring 1402 in physical communication with latch handle 304 and support rod 1306. In an example, back surface 1302 of button 306 may be in physical communication with latch handle 304 and hook portions 1304 may be located within the latch handle. In an example, the thickness of hook portions 1304 may be substantially thick enough to provide the necessary amount of strength to latch handle 304. In certain examples, hook portions 1304 and latch handle 304 may need to be strong enough to prevent pivot latch 220 from breaking when it is used to pull node 200 of FIG. 2 out of a chassis of an information handling system, such as chassis 102 of information handling system 100 in FIG. 1.

In an example, spring 1402 may be a compression spring such that spring may exert a force on support rod 1306. In this example, spring 1402 may bias button 306 in a locked position such that catches 402 may be located within lock notches 322. In certain examples, an individual may cause button to transition from locked position to an unlocked position based on a force being exerted on tab 920 that is greater than the force exerted on support rod 1306 by spring 1402. When this force is removed, spring 1402 may automatically push button 306 back towards the locked position.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A pivot latch for a node of an information handling system, the pivot latch comprising:

a main support configured to attach to the node;

a hinge located at an end of the main support;

a latch handle extending downward from the hinge, wherein the latch handle is configured to transition between a default position and a perpendicular position, wherein a force may be exerted against the latch handle when the latch handle is in the perpendicular position; and a button in physical communication with the main support and with the latch handle, such that when the button is moved to an unlock position, the latch handle automatically rotates a partial distance between the default position and the perpendicular position, wherein the main support includes a plurality of lock notches, wherein an end of the button is located within a first set of the lock notches when the latch handle is in the default position, and the end of the button is located within a second set of the lock notches when the latch handle is in the perpendicular position.

2. The pivot latch of claim 1, wherein the hinge includes:

a rotational rod; and a support component in physical communication with the rotational rod, wherein the support component is an upper portion of the latch handle, wherein the rotational rod causes the support component and the latch handle to automatically rotate the partial distance between the default position and the perpendicular position when the button is moved to the unlocked position.

3. The pivot latch of claim 2, further comprising: a tension spring located within the main support and in physical communication with the rotational rod of the hinge, wherein the tension spring exerts a force on the rotational rod and causes the latch handle to automatically rotate the partial distance between the default position and the perpendicular position when the button is moved to the unlocked position.

4. The pivot latch of claim 1, further comprising:

a release button; and a release component in physical communication with the release button, wherein the release component hinges in response to a downward force being exerted on the release button.

5. The pivot latch of claim 4, wherein the latch handle includes a catch portion, wherein when the latch handle is in the default position, the catch portion is located below an end of the release button and prevents the release button from moving downward in response to the downward force.

6. The pivot latch of claim 1, further comprising: a spring located within the latch handle and in physical communication with the button, the spring to bias the button toward a locked position.

7. The pivot latch of claim 6, wherein the latch handle is securely held in the default position when the button is in the locked position.

8. A node of an information handling system, the node comprising:

a chassis; and a pivot latch attached to a corner of the chassis, the pivot latch including:

a main support configured to attach to the node;

a hinge located at an end of the main support;

a latch handle extending downward from the hinge, wherein the latch handle is configured to transition between a default position and a perpendicular position, wherein a force may be exerted against the latch handle when the latch handle is in the perpendicular position;

a button in physical communication with the main support and with the latch handle, when the button is moved to an unlock position, the latch handle to automatically rotate a partial distance between the default position and the perpendicular position;

a release button; and a release component in physical communication with the release button, wherein the release component hinges in response to a downward force being exerted on the release button.

9. The node of claim 8, wherein the hinge includes:

a rotational rod; and a support component in physical communication with the rotational rod, wherein the support component is an upper portion of the latch handle, wherein the rotational rod causes the support component and the latch handle to automatically rotate the partial distance between the default position and the perpendicular position when the button is moved to the unlocked position.

10. The node of claim 9, wherein the pivot latch further includes: a tension spring located within the main support and in physical communication with the rotational rod of the hinge, wherein the tension spring exerts a force on the rotational rod and causes the latch handle to automatically rotate the partial distance between the default position and the perpendicular position when the button is moved to the unlocked position.

11. The node of claim 8, wherein the main support includes a plurality of lock notches, wherein an end of the button is located within a first set of the lock notches when the latch handle is in the default position, and the end of the button is located within a second set of the lock notches when the latch handle is in the perpendicular position.

12. The node of claim 8, wherein the latch handle includes a catch portion, wherein when the latch handle is in the default position, the catch portion is located below an end of the release button and prevents the release button from moving downward in response to the downward force.

13. The node of claim 8, the pivot latch further includes: a spring located within the latch handle and in physical communication with the button, the spring to bias the button toward a locked position.

14. The node of claim 13, wherein the latch handle is securely held in the default position when the button is in the locked position.

15. A pivot latch for a node of an information handling system, the pivot latch comprising:
   a main support configured to attach to the node, the main support including a plurality of lock notches;
   a hinge located at an end of the main support;
   a latch handle extending downward from the hinge, wherein the latch handle is configured to transition between a default position and a perpendicular position, wherein a force may be exerted against the latch handle when the latch handle is in the perpendicular position;
   a button in physical communication with the main support and with the latch handle, wherein an end of the button is located within a first set of the lock notches when the latch handle is in the default position, and the end of the button is located within a second set of the lock notches when the latch handle is in the perpendicular position, wherein when the button is moved to an unlock position the latch handle automatically rotates a partial distance between the default position and the perpendicular position; and
   a spring located within the latch handle and in physical communication with the button, the spring to bias the button toward a locked position.

16. The pivot latch of claim 15, wherein the hinge includes:
   a rotational rod; and
   a support component in physical communication with the rotational rod, wherein the support component is an upper portion of the latch handle, wherein the rotational rod causes the support component and the latch handle to automatically rotate the partial distance between the default position and the perpendicular position when the button is moved to the unlocked position.

17. The pivot latch of claim 16, further comprising: a tension spring located within the main support and in physical communication with the rotational rod of the hinge, wherein the tension spring exerts a force on the rotational rod and causes the latch handle to automatically rotate the partial distance between the default position and the perpendicular position when the button is moved to the unlocked position.

18. The pivot latch of claim 15, wherein the pivot latch further includes:
   a release button; and
   a release component in physical communication with the release button, wherein the release component hinges in response to a downward force being exerted on the release button.

* * * * *